(12) United States Patent
Braun

(10) Patent No.: US 6,300,892 B2
(45) Date of Patent: Oct. 9, 2001

(54) LINEARIZED MULTIBIT DIGITAL/ANALOG CONVERTER AND ITS USE IN A MULTIBIT DELTA-SIGMA ANALOG/DIGITAL CONVERTER

(75) Inventor: Christoph Braun, Düren (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/756,184

(22) Filed: Jan. 8, 2001

Related U.S. Application Data

(63) Continuation of application No. PCT/DE99/01979, filed on Jul. 1, 1999.

(30) Foreign Application Priority Data

Jul. 7, 1998 (DE) .............................................. 198 30 355

(51) Int. Cl.[7] .................................................. H03M 1/66
(52) U.S. Cl. .......................................... 341/144; 341/143
(58) Field of Search .................................. 341/143, 144, 341/155, 120

(56) References Cited

U.S. PATENT DOCUMENTS 5,404,142    4/1995  Adams et al. .
6,124,814 *  9/2000  Lee et al. .............................. 341/143
6,191,715 *  2/2001  Fowers .................................. 341/120

FOREIGN PATENT DOCUMENTS 0 506 079 B1   9/1992   (EP) .
0 704 978 A1   4/1996   (EP) .

OTHER PUBLICATIONS

R. Schreier et al.: "Noise–shaped multbit D/A convertor employing unit elements", Electronics Letters, vol. 31, No. 20, Sep. 28, 1995, pp. 1712–1713.

* cited by examiner

Primary Examiner—Brian Young
(74) Attorney, Agent, or Firm—Herbert L. Lerner; Laurence A. Greenberg; Werner H. Stemer

(57) ABSTRACT

A multibit digital/analog converter has M delta-sigma modulators and a sorting logic unit. The sorting logic unit selects a number of DA elements based on an input signal of the converter in such a way that the DA elements associated with the quantizers having the largest output signal are selected. The sorting logic unit provides output signals which are fed back negatively. oversampling and changing the allocation of the DA elements eliminates the error influence of the DA elements on the linearity with relatively little complexity.

5 Claims, 2 Drawing Sheets

FIG 2
| k | n | $y_1$ | $y_2$ | $y_3$ | $y_4$ | $y_5$ | $y_6$ | $y_7$ | $s_1$ | $s_2$ | $s_3$ | $s_4$ | $s_5$ | $s_6$ | $s_7$ |
|---|---|---|---|---|---|---|---|---|---|---|---|---|---|---|---|
| 1 | 0 | 0 | 1 | 2 | 2 | 1 | 0 | 3 | -1 | -1 | -1 | -1 | -1 | -1 | -1 |
| 2 | 1 | 1 | 3 | 2 | 1 | 3 | 2 | 1 | -1 | 1 | -1 | -1 | -1 | -1 | -1 |
| 3 | 3 | 3 | 0 | 3 | 3 | 1 | 2 | 3 | 1 | -1 | 1 | 1 | -1 | -1 | -1 |
| 4 | 5 | 3 | 2 | 3 | 3 | 2 | 1 | 3 | 1 | 1 | 1 | 1 | -1 | -1 | 1 |
| 5 | 4 | 1 | 2 | 3 | 0 | 3 | 2 | 3 | -1 | 1 | 1 | -1 | 1 | -1 | 1 |
FIG 3
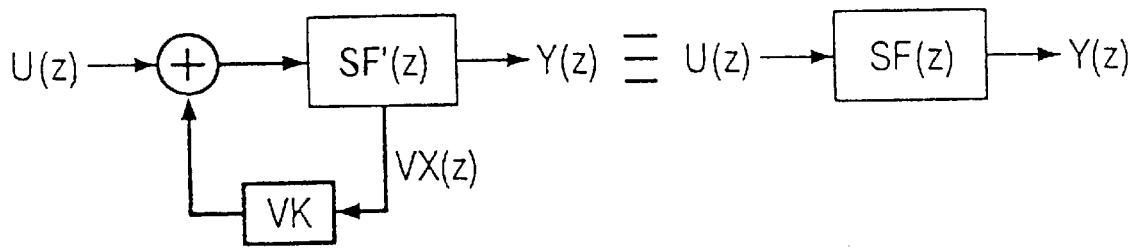
FIG 4
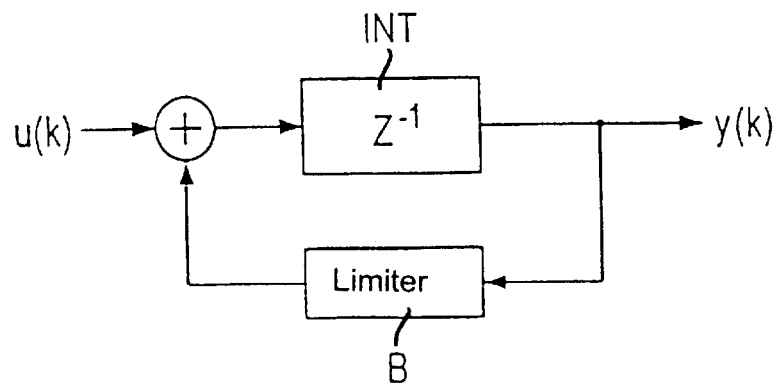

LINEARIZED MULTIBIT DIGITAL/ANALOG CONVERTER AND ITS USE IN A MULTIBIT DELTA-SIGMA ANALOG/DIGITAL CONVERTER

CROSS-REFERENCE TO RELATED APPLICATION

This application is a continuation of copending International Application No. PCT/DE99/01979, filed Jul. 1, 1999, which designated the United States.

BACKGROUND OF THE INVENTION

Field of the Invention

Delta-sigma AD converters have been used for digitizing audio signals since approximately the mid-1980s. Numerous investigations and many scientific works over the last three decades have led to a growing field of use for these converters. Such a converter has a control loop whose forward path contains a loop filter and a quantizer and whose feedback path contains a D/A converter. Relatively high-order modulator structures and multibit D/A converters are now also increasingly used to try such converters for the higher-frequency range above the audio range.

Sigma-delta A/D converters sample the analog input signal at a much higher rate than so-called Nyquist converters. In this case, the amplitude resolution is traded for time resolution. A so-called decimation filter can be used, as previously, to generate a data stream with high resolution and at a low rate. The use of multibit D/A converters instead of single-bit D/A converters makes it possible to reduce the oversampling rate substantially on account of the lower quantization noise. In addition, loop filters with a relatively small phase margin and hence a relatively high low-pass filter range gain may be used, which permit an even better signal-to-noise ratio. However, the linearity is in this case essentially dependent only on the accuracy of the D/A converter, because the control loop of the modulator does not suppress the interference from the D/A converter. The oversampling during the delta-sigma modulation means that the interfering influence of the tolerance of the elements in the D/A converter on the useful signal can be significantly reduced using noise shaping. Without noise shaping, a correspondingly large number of D/A elements are selected in the D/A converter on the basis of an input signal, and their output signals are summed to form an output signal for the D/A converter.

In a manner which is known per se, the effects of production-related differences among the elements of the digital/analog converter can be significantly reduced by an appropriate element selection circuit. A corresponding method is described in Electronic Letters, Vol. 31, No. 20, Sep. 28, 1995, for example. To produce noise shaping, the D/A converter used in this context is a circuit including uniform delta-sigma modulators which are coupled through the use of a common vector quantizer. The vector quantizer ensures that the number of elements prescribed by the input signal are selected by the delta-sigma modulators, with specifically those modulators which have the largest output signal being selected. In this case, the vector quantizer also adopts the customary function of a quantizer for the delta-sigma modulation, because the feedback takes place via the output signal from the vector quantizer. To stabilize the entire system, the input signal taken for the delta-sigma modulation is the output component from the vector filter having the smallest value. The architecture presented in the prior art, with the corresponding stabilization through the use of the input signal, necessitates a high level of circuit complexity for the vector quantizer and additionally requires a minimum detection feature. In addition, the chosen structure for the delta-sigma modulators is very sensitive to coefficient errors and therefore requires coefficient multipliers having a large word length for complex filter structures.

SUMMARY OF THE INVENTION

It is accordingly an object of the invention to provide a multibit D/A converter which overcomes the above-mentioned disadvantages of the heretofore-known D/A converters of this general type and which has a noise shaping such that the interference from the D/A converter on account of the component tolerances is significantly reduced and the additional circuit complexity mentioned above is avoided. It is a further object of the invention to provide a multibit delta-sigma A/D converter using the multibit D/A converter according to the invention.

With the foregoing and other objects in view there is provided, in accordance with the invention, a multibit digital/analog converter, including:

a multibit digital/analog converter input;

a 1/M divider circuit, M being an integer number;

M summers having summer inputs and summer outputs, respective ones of the summer inputs being connected, via the 1/M divider circuit, to the multibit digital/analog converter input;

a plurality of loop filters;

a plurality of quantizers having respective quantizer inputs and quantizer outputs, each of the summer outputs being connected, via a respective one of the loop filters, to a respective one of the quantizer inputs;

a plurality of DA elements having outputs;

a sorting logic circuit having a control input, sorting logic inputs, and sorting logic outputs;

the sorting logic inputs being connected to respective ones of the quantizer outputs, the sorting logic outputs being connected to respective ones of the DA elements, the control input being connected to the multibit digital/analog converter input;

the sorting logic circuit providing output signals fed back negatively to respective ones of the summer inputs; and an output summer having output summer inputs respectively connected to the outputs of the DA elements, the output summer providing an analog output signal.

According to another feature of the invention, the quantizers provide, at the quantizer outputs, respective output signals with respective output signal magnitudes. The sorting logic circuit is configured such that the quantizers are sorted based on the output signal magnitudes, and only a given number of the DA elements is connected to given ones of the quantizer outputs, which provide largest ones of the output signal magnitudes. The given number of the DA elements is dependent on a signal at the multibit digital/analog converter input.

According to yet another feature of the invention, the loop filters have respective internal feedback paths.

According to a further feature of the invention, the loop filters include respective integrators and respective internal feedback paths. The integrators have respective limiters in the feedback paths.

With the objects of the invention in view there is also provided, an analog/digital converter configuration, including:

a multibit delta-sigma analog/digital converter having a feedback path;

a multibit digital/analog converter provided in the feedback path, wherein the multibit digital/analog converter includes a multibit digital/analog converter input; a 1/M divider circuit, M being an integer number; M summers having summer inputs and summer outputs, respective ones of the summer inputs being connected, via the 1/M divider circuit, to the multibit digital/analog converter input; a plurality of loop filters; a plurality of quantizers having respective quantizer inputs and quantizer outputs, each of the summer outputs being connected, via a respective one of the loop filters, to a respective one of the quantizer inputs; a plurality of DA elements having outputs; a sorting logic circuit having a control input, sorting logic inputs, and sorting logic outputs; the sorting logic inputs being connected to respective ones of the quantizer outputs, the sorting logic outputs being connected to respective ones of the DA elements, the control input being connected to the multibit digital/analog converter input; the sorting logic circuit providing output signals fed back negatively to respective ones of the summer inputs; and an output summer having output summer inputs respectively connected to the outputs of the DA elements, the output summer providing an analog output signal.

Other features which are considered as characteristic for the invention are set forth in the appended claims.

Although the invention is illustrated and described herein as embodied in a linearized multibit digital/analog converter and its use in a multibit delta-sigma analog/digital converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a table for describing a sorting logic unit as used in FIG. 1;

FIG. 3 is a circuit diagram illustrating a specific embodiment of a loop filter in the feedback path; and FIG. 4 is a circuit diagram of a further embodiment of the loop filter in the feedback path shown in FIG. 1.

DESCRIPTION OF THE PREFERRED EMBODIMENTS

Figure 1:
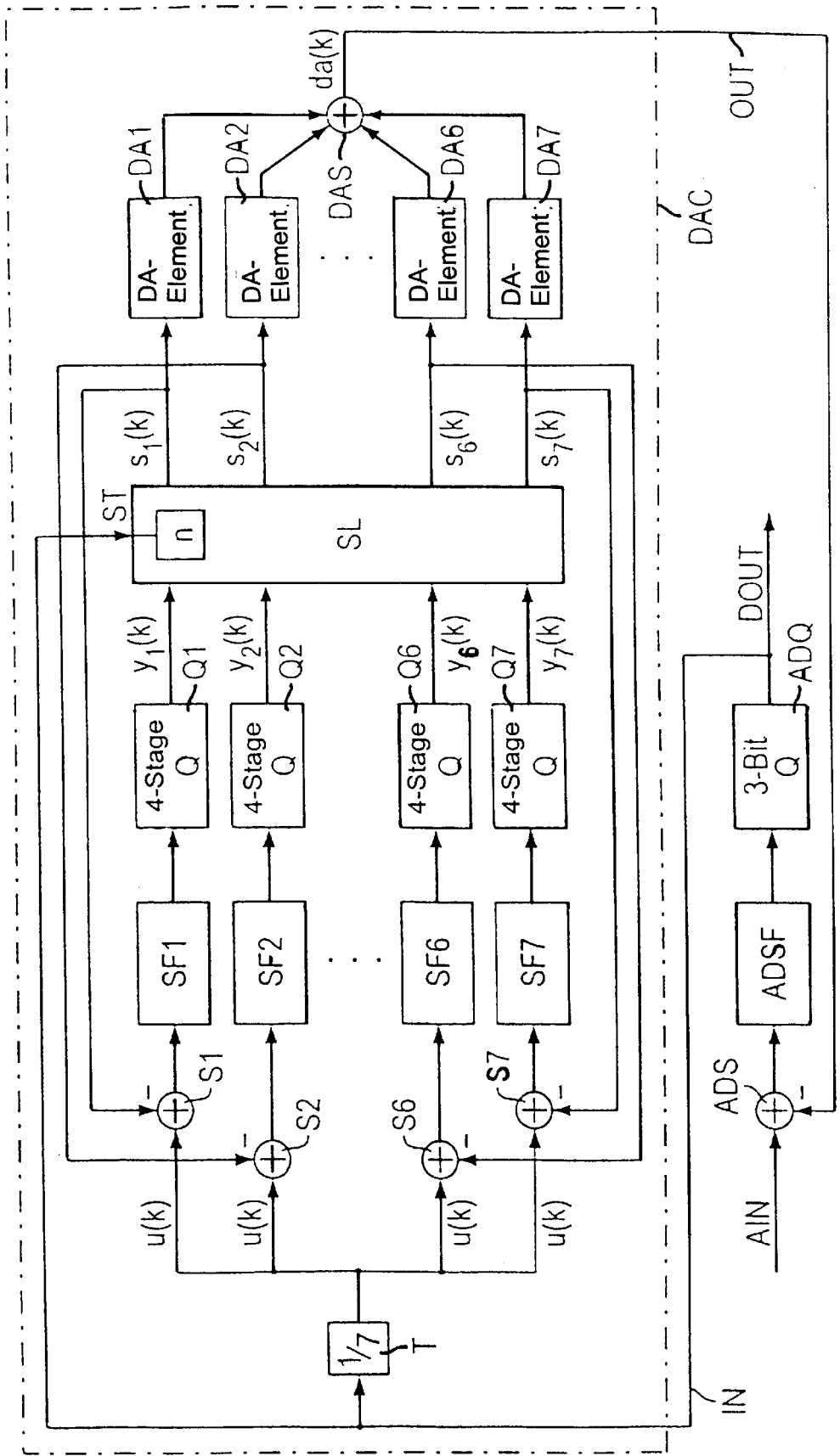
FIG. 1 is a circuit diagram of a delta-sigma A/D converter with noise shaping for a three-bit D/A converter.

Referring now to the figures of the drawings, the invention is explained in detail. The basic idea of the invention is that there are M delta-sigma modulators and M DA elements, and each modulator selects its associated DA element such that the resultant signal of a respective element considered in isolation simulates the input signal for the D/A converter. The analog output signal from the D/A converter then results from the superimposition of the individual signals from the M DA elements. In this case, the input signal for the M delta-sigma modulators is equivalent to the Mth part of the input signal for the digital/analog converter.

The invention results in a considerable reduction in circuit complexity because the quantizers, in particular, can be implemented with a low number of stages; in this case, without instabilities arising in doing this. State vector feedback or state value limitation in the loop filters in the digital/analog converter according to the invention also permits, in contrast to the prior art, stable delta-sigma converters having an order >2 with a relatively low level of circuit complexity.

FIG. 1 shows an exemplary embodiment of a multibit delta-sigma A/D converter whose forward path contains, in sequence, a summer ADS, a loop filter ADSF and a multibit quantizer ADQ, having a resolution of three bits for example, and also a feedback path from the digital output DOUT of the delta-sigma A/D converter to the negative input of the summer ADS, containing a multibit digital/analog converter DAC according to the invention. The summer ADS subtracts an analog output signal da(k) of the converter DAC from analog amplitude samples AIN. The output signal DOUT represents the input signal IN for the digital/analog converter DAC and is divided in a divider circuit T by the number M of the DA elements present in the D/A converter. In this case, there are M=7 identical DA elements DA1 . . . DA7, whose output signals form the analog output signal da(k) at the output OUT of the digital/analog converter DAC using a summer DAS. The DA elements used are, by way of example, resistors, in a similar manner as in the case of a summation amplifier in analog technology. Since the DA elements, disregarding the component tolerances, are all of the same magnitude, only the absolute number of selected DA elements and not the specific selection of the DA elements is of significance for the signal da(k). A sorting logic unit SL forms M selection signals s1(k) . . . s7(k) for the M=7 DA elements from M=7 output signals y1(k) . . . y7(k) from a corresponding number of multibit quantizers Q1 . . . Q7, having for example a two-bit resolution, on the basis of the input signal IN. The signal at the input IN and respectively at the input ST of the sorting logic unit is used in the sorting logic unit to ascertain the number n of DA-elements which are to be selected. Each selection signal s1(k). . . s7(k) is subtracted from the output signal u(k) from the divider T in a dedicated summer S1 . . . S7 and is supplied to the input of a respective loop filter SF1 . . . SF7, whose output is connected to a respective quantizer Q1 . . . Q7.

The sorting logic unit SL now ensures that, on the basis of the input signal at the input IN, an appropriate number of DA elements are selected, such that those n DA elements whose associated output signals are the largest are always selected, which means that specifically those feedback loops having the largest values receive negative feedback and the others receive positive feedback. The sorting logic unit is advantageously of such a type that a selection signal is equal to 1 if a DA element is selected, and a selection signal is equal to $^-1$ if the appropriate DA element is not selected. The output signals for unselected DA elements are thus fed back positively overall, the result of which is that these loops and the associated DA elements are then also selected later instead of the others, when the output signals from the quantizers have become correspondingly large as a result. The oversampling thus more or less evens out the nonlinearities in the converter on account of the component tolerances in the DA elements, and hence increases the linearity.

In-order to obtain a conventional DA converter which is comparable to the exemplary embodiment of the invention specified here, twelve-stage quantizers and, additionally, a minimum detection unit are necessary instead of the four-stage quantizers Q1 . . . Q7.

To illustrate the operation of the sorting logic unit SL, FIG. 2 shows, by way of example, a table containing the running variable k=1 . . . 5 in sequence for a different number of DA elements n=0, 1, 3, 5 and 4 with respect to the signals y1 . . . y7 and to the selection signals S1 . . . S7. When k=1 then n=0, which means that no DA element at all is to be selected. When k=1 and n=0, the signals y1 . . . y7 are equal to 0, 1, 2, 2, 1, 0 and 3 and the selection signals S1 . . . S7 are all equal to ⁻1, because there is no single DA element selected on account of n=0. In the row for k=2, n=1, which means that a single DA element needs to be selected, and, for the signals y1 . . . y7=1, 3, 2, 1, 3 , 2 and 1, this means that the selection signal S2 is equal to 1 and all the other selection signals are equal to ⁻1 because y2 has the first largest value, namely the value 3. The row for k=3 deals with the case where n=3 DA elements, where the signals y1 . . . y7 are equal to 3, 0, 3, 3, 1, 2 and 3 and consequently the associated first three largest selection signals, that is to say S1, S3 and S4, are equal to 1 and the remainder are again equal to ⁻1. The row for k=4 deals with the case where n=5 DA elements, where the signals y1 . . . y7 are equal to 3, 2, 3, 3, 2, 1 and 3 and the selection signals, except for the selection signals S5 and S6, which are again ⁻1, are all equal to 1. In the last row for k=5 and n=4, the signals y1 . . . y7 are 1, 2, 3, 0, 3, 2 and 3 and the associated selection signals S1, S4 and S6 are equal to ⁻1 and the selection signals S2, S3, S5 and S7 are equal to 1.

On account of the limited computation accuracy, it is advantageous if the M digital delta-sigma modulators, that is to say the loop filters SF1 . . . SF7 with the respective quantizers Q1 . . . Q7, are stable even without feedback. As FIG. 3 shows, this can be achieved through the use of a loop filter with an appropriate internal state vector feedback VK.

If the order of the M delta-sigma modulators, that is to say the order of the loop filters SF1 . . . SF7, is higher than 2, then instability may arise when the converter is driven at a high level or dynamic range. To prevent this, it is advantageous if, as FIG. 4 shows, the feedback path of each integrator INT in a loop filter contains a limiter 3. The limiter prevents values of the state variables that are too large and thus the integrators return automatically to a stable state when driven at a lower level.

I claim:

1. A multibit digital/analog converter, comprising:
a multibit digital/analog converter input;
a 1/M divider circuit, M being an integer number;
M summers having summer inputs and summer outputs, respective ones of said summer inputs being connected, via said 1/M divider circuit, to said multibit digital/analog converter input;
a plurality of loop filters;
a plurality of quantizers having respective quantizer inputs and quantizer outputs, each of said summer outputs being connected, via a respective one of said loop filters, to a respective one of said quantizer inputs;
a plurality of DA elements having outputs;
a sorting logic circuit having a control input, sorting logic inputs, and sorting logic outputs;
said sorting logic inputs being connected to respective ones of said quantizer outputs, said sorting logic outputs being connected to respective ones of said DA elements, said control input being connected to said multibit digital/analog converter input;
said sorting logic circuit providing output signals fed back negatively to respective ones of said summer inputs; and
an output summer having output summer inputs respectively connected to said outputs of said DA elements, said output summer providing an analog output signal.

2. The multibit digital/analog converter according to claim 1, wherein:
said quantizers provide, at said quantizer outputs, respective output signals with respective output signal magnitudes;
said sorting logic circuit is configured such that said quantizers are sorted based on the output signal magnitudes, and only a given number of said DA elements is connected to given ones of said quantizer outputs providing largest ones of the output signal magnitudes, the given number of said DA elements is dependent on a signal at said multibit digital/analog converter input.

3. The multibit digital/analog converter according to claim 1, wherein said loop filters have respective internal feedback paths.

4. The multibit digital/analog converter according to claim 1, wherein said loop filters include respective integrators and respective internal feedback paths, said integrators have respective limiters in said feedback paths.

5. An analog/digital converter configuration, comprising:
a multibit delta-sigma analog/digital converter having a feedback path;
a multibit digital/analog converter provided in said feedback path;
said multibit digital/analog converter including:
a multibit digital/analog converter input;
a 1/M divider circuit, M being an integer number;
M summers having summer inputs and summer outputs, respective ones of said summer inputs being connected, via said 1/M divider circuit, to said multibit digital/analog converter input;
a plurality of loop filters;
a plurality of quantizers having respective quantizer inputs and quantizer outputs, each of said summer outputs being connected, via a respective one of said loop filters, to a respective one of said quantizer inputs;
a plurality of DA elements having outputs;
a sorting logic circuit having a control input, sorting logic inputs, and sorting logic outputs;
said sorting logic inputs being connected to respective ones of said quantizer outputs, said sorting logic outputs being connected to respective ones of said DA elements, said control input being connected to said multibit digital/analog converter input;
said sorting logic circuit providing output signals fed back negatively to respective ones of said summer inputs; and
an output summer having output summer inputs respectively connected to said outputs of said DA elements, said output summer providing an analog output signal.

* * * * *